(12) United States Patent
Trampitsch et al.

(10) Patent No.: US 9,900,016 B1
(45) Date of Patent: Feb. 20, 2018

(54) COMPENSATION OF NON-LINEARITY AT DIGITAL TO ANALOG CONVERTERS

(71) Applicant: INTEL IP CORPORATION, Santa Clara, CA (US)

(72) Inventors: Stefan Trampitsch, Klagenfurt (AT); Daniel Gruber, St. Andrä (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/588,065

(22) Filed: May 5, 2017

(51) Int. Cl.
*H03M 1/06* (2006.01)
*H03M 1/66* (2006.01)

(52) U.S. Cl.
CPC ........... *H03M 1/0602* (2013.01); *H03M 1/66* (2013.01)

(58) Field of Classification Search
CPC .............................. H03M 1/0602; H03M 1/66
USPC .................................................. 341/118, 144
See application file for complete search history.

(56) References Cited

U.S. PATENT DOCUMENTS

| | | | | |
|---|---|---|---|---|
| 8,295,790 B2* | 10/2012 | Koren | ................... | H03F 1/3247 455/114.1 |
| 8,471,632 B2* | 6/2013 | Onishi | ................... | H03F 1/3247 330/149 |
| 8,611,836 B2* | 12/2013 | Ripley | ................... | H03G 3/007 455/127.2 |
| 2014/0105255 A1 | 4/2014 | Kuttner | | |

\* cited by examiner

*Primary Examiner* — Khai M Nguyen
(74) *Attorney, Agent, or Firm* — Lowenstein Sandler LLP (57) ABSTRACT

An apparatus for compensating for nonlinearities in a DAC caused by variabilities of a power supply. The apparatus may include a power supply, a processing component, and a front-end circuit. The power supply may generate power, where the power includes variabilities in a power. The processing component may generate a digital signal. The front-end circuit may be operatively coupled to the power supply and the processing component. The front-end circuit may receive the power from the power supply, identify the nonlinearities in the power, receive the digital signal from the processing component, and adjust the digital signal for the nonlinearities to obtain an input signal to send to a digital to analog converter (DAC).

19 Claims, 8 Drawing Sheets

COMPENSATION OF NON-LINEARITY AT DIGITAL TO ANALOG CONVERTERS

BACKGROUND

The disclosure relates to the field of wireless communications, including compensation for variations of a power supply.

BRIEF DESCRIPTION OF THE DRAWINGS

Various exemplary implementations of the present disclosure will be understood more fully from the detailed description given below and from the accompanying drawings of various exemplary implementations of the disclosure.

DETAILED DESCRIPTION

In the following description, various aspects of the illustrative exemplary implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials, and configurations are set forth in order to provide a thorough understanding of the illustrative exemplary implementations. However, it will be apparent to one skilled in the art that the present disclosure may be practiced without the specific details. In other instances, well-known features are omitted or simplified in order not to obscure the illustrative exemplary implementations.

A communication device may generate signals to send to another device in a communication network. The communication device may include a signal processor to process the signals and a digital-to-analog converter (DAC) to convert a digital signal, such as binary code, to an analog signal to send to the other device.

The communication device may also include a power supply to provide power to the signal processor and the DAC. However, a variation in the power supply may cause the DAC to introduce nonlinearities into the output signal where the supply voltage has a code dependence with the digital signal. For example, the nonlinearities may be caused because the supply impedance is finite and the current drawn by the DAC may cause a voltage dependent drop or a fluctuation over this impedance. The nonlinearities may have a negative impact on the analog signals sent to the other devices. For example, the DAC may modulate the signal generated by a processing component of the communications device. In one implementation, the processing component may include a signal generator, a processor, a waveform generator, a system on a chip (SoC) and so forth. In another implementation, the signal may be generated by software executing on the processing component. The variabilities of the power supply may cause distortions, interferences, variations, and harmonics in the signals when the variabilities mix with the digital signal as the DAC converts the digital signal to an analog signal and cause nonlinearities. The distortions, interferences, variations, and harmonics may degrade a linearity of the analog signal. The degradation of the analog signal may also cause the analog signals to leak to adjacent communication channels outside of a specified spectrum for communications, e.g., increasing the adjacent channel leakage ratio (ACLR) of the analog signal.

Conventionally, a low-dropout regulator (LDO) may be operatively coupled with the power supply and the DAC to remove the nonlinearities. The LDO may provide a stable supply voltage to the DAC. However, the gain bandwidth of the LDO may be set to a bandwidth lower than, equal to, or higher than a bandwidth of a digital input signal in order to provide a low supply impedance to remove the nonlinearities. When the bandwidth of the LDO is relatively high, a power consumption level of the LDO may also be relatively high. The high current may increase a power usage level of the communication device. Additionally, the LDO has a limited bandwidth range of $10^{th}$ of megahertz (MHz). When the communication device operates at higher bandwidths, such as 100 MHz, the LDO may not be able to supply a stable voltage to the DAC.

Alternatively, an external blocking capacitor can be used to lower impedance values of the power supply and provide a stable supply voltage. However, the external blocking capacitor must be relatively large in size in order to provide the lower impedance values. The size of the capacitor may limit an integrability of the capacitor into a communications device with a limited amount of internal space, such as a smartphone. Additionally, the blocking capacitor shows a bandwidth in the range of $10^{th}$ of MHz. When the communication device operates at higher bandwidths, such as 100 MHz, the blocking capacitor may not be able to supply a stable voltage to the DAC.

The present disclosure addresses the above-mentioned and other deficiencies by a digital front end or a baseband circuit pre-distorting a digital signal to compensate for the nonlinearities at DAC output signal that are caused by a non-ideal power source. The front-end unit or the baseband circuit may pre-distort the digital signal to compensate for nonlinearities of the power source and send the digital signal to the DAC. The front-end unit or the baseband circuit compensating for the nonlinearities may increase an energy efficiency of the communications device by reducing a power consumption of the communication device used to compensate for the nonlinearities.

Figure 1A:
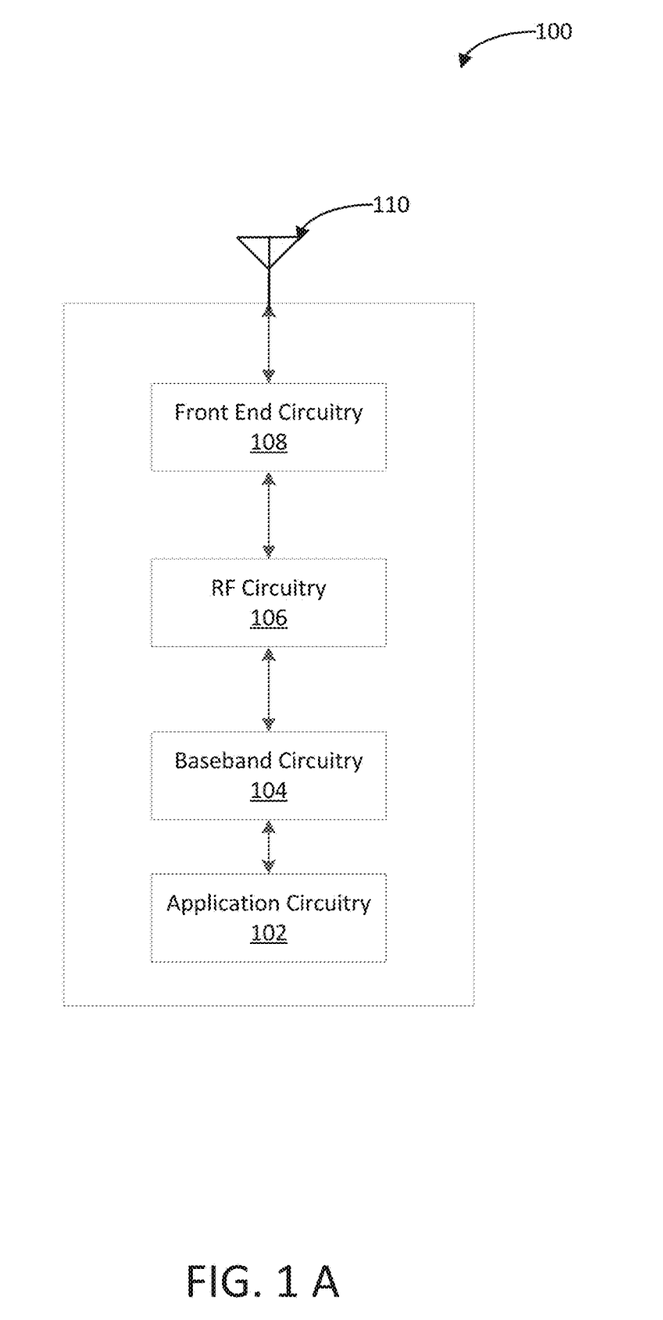
FIG. 1A is a block diagram illustrating exemplary components of an electronic device implementing aspects of the disclosure, according to an exemplary implementation.

Exemplary implementations described herein may be implemented into a system using any suitably configured hardware and/or software. FIG. 1A illustrates, for one exemplary implementation, a block diagram of example components of a mobile device 100. In some exemplary implementations, the mobile device 100 may include application circuitry 102, baseband circuitry 104, Radio Frequency (RF) circuitry 106, front-end circuitry 108, and one or more antennas 110, coupled together at least as shown.

In the mobile device 100, the application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include a storage element and may be configured to execute instructions stored in the storage element to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some exemplary implementations, the baseband circuitry 104 may include a second generation (2G) baseband processor, a third generation (3G) baseband processor, a fourth generation (4G) baseband processor, and/or other baseband processor(s) for other existing generations, generations in development, or to be developed in the future (e.g., fifth generation (5G), 6G, or the like). The baseband circuitry 104 may handle various radio control functions that enable communication with one or more radio networks via the RF circuitry 106. The radio control functions may include, but are not limited to, signal modulation/demodulation, encoding/decoding, radio frequency shifting, etc. In some exemplary implementations, the baseband circuitry 104 may determine a channel or frequency for uplink or downlink communications based on messages received from the network. The baseband circuitry 104 may instruct the RF circuitry 106 to monitor particular channels or frequencies as well as to transmit on particular channels or frequencies.

In some exemplary implementations, the baseband circuitry 104 may generate clock signals or perform phase modulation using a DTC. Accordingly, the baseband circuitry 104 may include a DTC calibration system that determines the phase output of a DTC in response to DTC inputs.

In some exemplary implementations, modulation/demodulation circuitry of the baseband circuitry 104 may include Fast-Fourier Transform (FFT), preceding, and/or constellation mapping/demapping functionality. In some exemplary implementations, encoding/decoding circuitry of the baseband circuitry 104 may include convolution, tail-biting convolution, turbo, Viterbi, and/or Low Density Parity Check (LDPC) encoder/decoder functionality. Implementations of modulation/demodulation and encoder/decoder functionality are not limited to these examples and may include other suitable functionality in other implementations.

In some exemplary implementations, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) of the baseband circuitry 104 may be configured to run elements of the protocol stack for signaling of the PHY, MAC, RLC, PDCP, NAS and/or RRC layers. In some exemplary implementations, the baseband circuitry may include one or more audio digital signal processor(s) (DSP). The audio DSP(s) may include elements for compression/decompression and echo cancellation and may include other suitable processing elements in other exemplary implementations. Components of the baseband circuitry may be suitably combined in a single chip, a single chipset, or disposed on a same circuit board in some exemplary implementations. In some exemplary implementations, some or all of the constituent components of the baseband circuitry 104 and the application circuitry 102 may be implemented together such as, for example, on a system on a chip (SoC).

In some exemplary implementations, the baseband circuitry 104 may provide for communication compatible with one or more radio technologies. For example, in some exemplary implementations, the baseband circuitry 104 may support communication with an evolved universal terrestrial radio access network (EUTRAN) and/or other wireless metropolitan area networks (WMAN), a wireless local area network (WLAN), a wireless personal area network (WPAN). Implementations in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various exemplary implementations, the RF circuitry 106 may include switches, filters, amplifiers, etc. to facilitate the communication with the wireless network. RF circuitry 106 may include a receive signal path which may include circuitry to down-convert RF signals received from the front end circuitry 108 and provide baseband signals to the baseband circuitry 104. RF circuitry 106 may also include a transmit signal path which may include circuitry to up-convert baseband signals provided by the baseband circuitry 104 and provide RF output signals to the front end circuitry 108 for transmission.

In some exemplary implementations, the RF circuitry 106 may generate clock signals or perform modulation using a DTC. Accordingly, the RF circuitry 106 may include a DTC calibration system that determines the phase output of a DTC in response to DTC inputs.

Front end circuitry 108 may include a receive signal path which may include circuitry configured to operate on RF signals received from one or more antennas 110, amplify the received signals and provide the amplified versions of the received signals to the RF circuitry 106 for further processing. Front end circuitry 108 may also include a transmit signal path which may include circuitry configured to amplify signals for transmission provided by the RF circuitry 106 for transmission by one or more of the one or more antennas 110.

In some exemplary implementations, the front end circuitry 108 may include a TX/RX switch to switch between transmit mode and receive mode operation. The front end circuitry 108 may include a receive signal path and a transmit signal path. The receive signal path of the front end circuitry 108 may include a low-noise amplifier (LNA) to amplify received RF signals and provide the amplified received RF signals as an output (e.g., to the RF circuitry 106). The transmit signal path of the front end circuitry 108 may include a power amplifier (PA) to amplify input RF signals (e.g., provided by RF circuitry 106), and one or more filters to generate RF signals for subsequent transmission (e.g., by one or more of the one or more antennas 110).

The mobile device 100 may include components as described with reference to FIG. 3 below to perform operations as described with reference to FIGS. 4 and 6. For example, the mobile device 100 may include a non-ideal power supply, the front end circuitry 108, and the baseband circuitry 104 that perform at least some of the operations as described with reference to FIGS. 4 and 6. A non-ideal power supply generates variabilities in the power provided to a DAC.

Figure 1B:
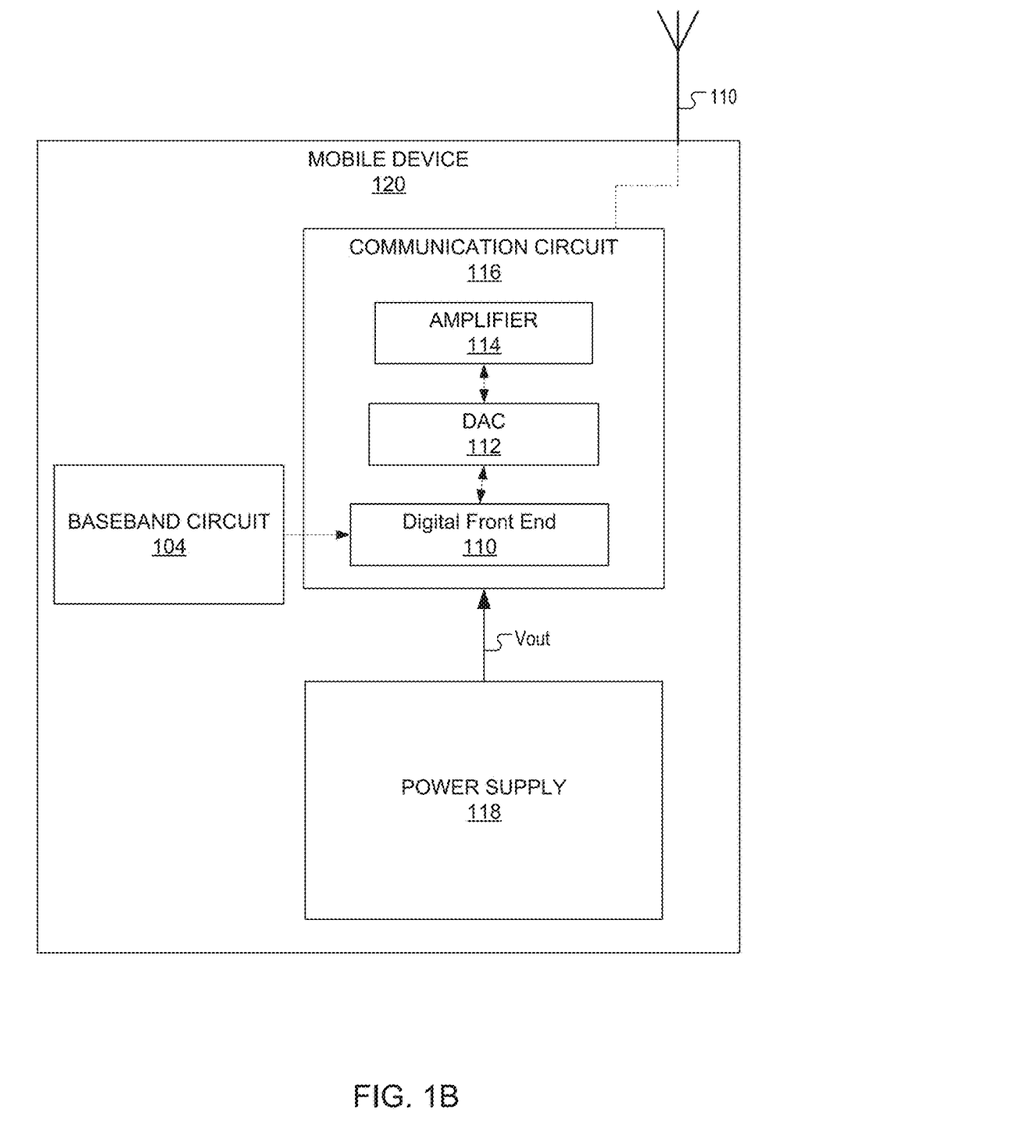
FIG. 1B shows a block diagram of a communication device according to one exemplary implementation.

FIG. 1B shows a block diagram of a mobile device 120 according to one exemplary implementation. Some of the features in FIG. 1B are the same or similar to the some of the features in FIG. 1A as noted by same reference numbers, unless expressly described otherwise. The mobile device 120 may include a communication circuit 116, an antenna 110, a baseband circuit 104, and a power supply 118.

The communications circuit 102 may be connected to the power supply 118. The power supply 118 may provide power to the digital front end 110, the DAC 112, and the amplifier 114. In one example, the power supply 118 may include a battery and traces to provide the power to the communication circuit 116. As the power supply 118 provides the power to the communications circuit 102, the power supply may produce variability, like ripples, on the generated supply voltage.

The baseband circuit 104 may be operatively coupled to the communications circuit 102. The baseband circuit 104 may generate a digital signal to send to the communications circuit 102 to be communicated to another device via the antenna 110. For example, the baseband circuit 104 may be a processing component of a mobile communication device that generates a baseband signal to send to the other device.

The communication circuit 116 may include a digital front end 110, a DAC 112, and an amplifier 114. The digital front end 110 may process the digital signal to prepare the digital signal for transmission to the other device. In one example, the digital front end 110 may be a signal processor that receives a digital signal from the baseband circuit 104. The digital front end 110 may filter or compress the digital signal. The digital front end 110 may also pre-distort the digital signal to compensate for nonlinearities at the DAC 112 introduced by the power supply 118. The pre-distortion may be a distortion in the digital signal generated by the digital front end 110 to compensate for the nonlinearities at the DAC 112, as discussed below.

In one example, the variabilities of the power supply 118 may be caused by a trace that goes from the power supply 118 to the DAC 112 to provide power to the DAC 112. The trace may have some impedance which introduces variability to the supply voltage or current the power supply 118 provides to the DAC 112. For example, the supply network that connects the power supply 118 to the DAC 112 may include resistive, capacitive, and/or inductive elements that introduce the variability to the power provided to the DAC 112. This impedance of the trace may cause a voltage or current drop or fluctuation, which is a variability in the supply voltage or current. For example, when the supply current is drawn from a power supply with a finite impedance, the current causes a code-dependent change of the supply voltage, as shown in the following equations:

$$V_{DD}(t) = V_{DC} + i_{DAC}(t) * T(t)$$

$$= V_{DC} + g(n(t)) * T(t)$$

$$= V_{DC} + v_d(t),$$

where $T(t)$ is the impulse response of the supply network. The function $g(n(t))$ is the nonlinear relation between the number of active cells of the capacitive RFDAC and the current $i_{DAC}(t)$ drawn by the DAC 112. The number of active cells depends on the digital input signal c, i.e. $n=f(c)$. The distortions $v_d(t)$ caused by the imperfect supply network are superimposed onto the voltage $V_{DC}$.

The code dependent supply voltage variations are mixed with the digital signal and generate distortions in the output signal of the DAC 112 which in this example is a mixing capacitive RFDAC, as shown in the following equations:

$$y(t) = \frac{n(t)}{N} V_{DD}(t) LO(t) = \frac{n(t)}{N} LO(t)(V_{DC} + v_d(t)) = y_w(t) + y_d(t).$$

where $V_{DD}$ is a supply voltage for the DAC 112, LO is a carrier signal, t is time, n is the number of active cells, $v_d(t)$ is an influence of the digital signals on the supply voltage. $V_{DD}$ is an ideal supply voltage. The output of the DAC, $y_d(t)$ includes an undistorted signal $$y_w(t) = \frac{n(t)}{N} LO(t) V_{DC}$$

and nonlinear distortions $$y_d(t) = \frac{n(t)}{N} LO(t) v_d(t).$$

The nonlinear distortions may increase the error vector magnitude (EVM) and the adjacent channel leakage-power ratio (ACLR) of the analog signal.

The digital front end 110 may recreate the variabilities of the supply voltage and introduce a distortion in the digital signal to cancel out nonlinearities at the DAC. To generate or recreate the distortion, the digital front end 110 may modulate a distorted signal on top of the digital signal that has a phase opposite to a portion of the signal with the nonlinearities that is generated at the DAC 112. The digital front end 110 may send the digital signal to the DAC 112. The DAC 112 may convert the digital signal into an analog signal, where the distortion in the digital signal cancels or suppresses the nonlinearities introduced by the variabilities in the supply voltage. In one implementation, the DAC 112 may be a capacitive DAC. The DAC 112 may be operatively coupled to the amplifier 114. The DAC 112 may send the analog signal to the amplifier 114. The amplifier 114 may adjust an amplitude of the analog signal. In another example, software executing on the processing component may adjust the amplitude of the analog signal. The communications circuit 102 may transmit the analog signal via the antenna 110 to another device.

Figure 2:
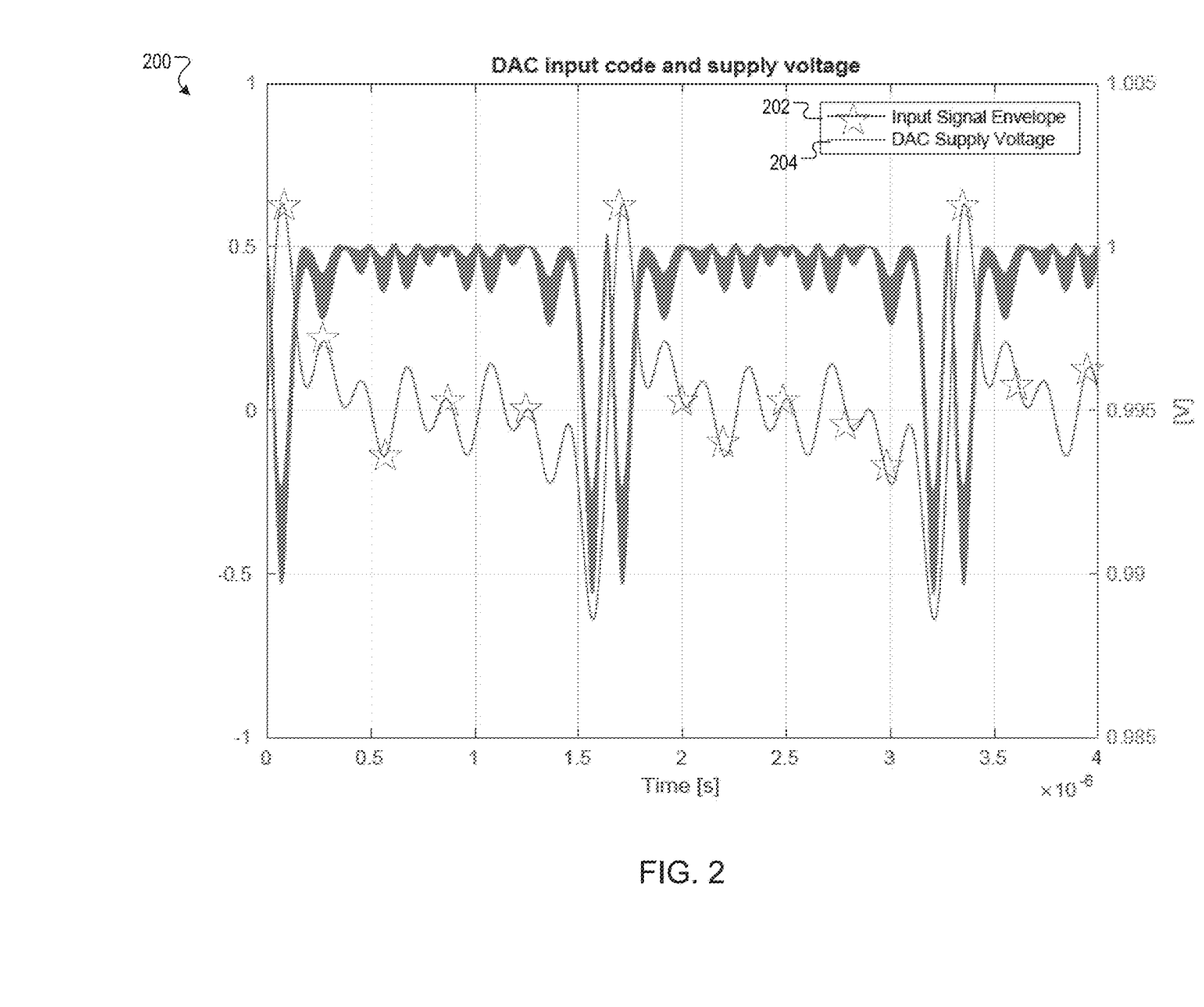
FIG. 2 illustrates a graph of variabilities generated by a power supply according to one exemplary implementation.

FIG. 2 illustrates a graph 200 of variabilities generated by a power supply according to one exemplary implementation. The graph 200 may include a line indicating an input signal envelope 202 and a DAC supply voltage 204. The DAC supply voltage 204 may be dependent on the input signal envelope 202. The graph 200 illustrates an input signal envelope 202 for the input code signal and a variation in the resulting supply voltage 204. In this example, the ideal supply voltage would be 1 volt. The supply voltage 204 provided by the power supply may differ from the ideal 1V because of the impedance of the power supply and/or the lines connecting the power supply to one or more.

Figure 3A:
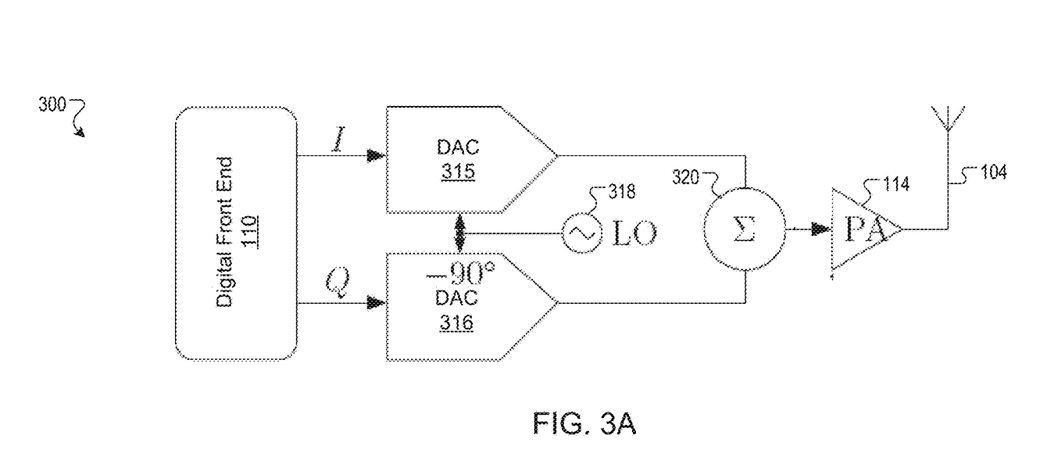
FIG. 3A illustrates a schematic level diagram of a communications circuit with an in-phase/quadrature (I/Q) architecture according to one exemplary implementation.

FIG. 3A illustrates a schematic level diagram of a communications circuit 300 with an in-phase/quadrature (I/Q) architecture according to one exemplary implementation. Some of the features in FIG. 3A are the same or similar to some of the features in FIG. 1 as noted by same reference numbers, unless expressly described otherwise. For example, the communications circuit 300 may be one implementation of the communications circuit 102 according to one exemplary implementation.

The communications circuit 300 may include the digital front end 110, an in-phase (I) DAC 315, a quadrature (Q) DAC 316, a local oscillator (LO) 318, a combiner 320, and the amplifier 114. The digital front end 110 may separate a digital signal received from a processing component into a real (I) portion and an imaginary (Q) portion. The digital front end 110 may be operatively coupled to the I-DAC 315 and the Q-DAC 316. The digital front end 110 may pre-distort the real portion of the digital signal and send the real portion of the digital signal to the I-DAC 315. The digital front end 110 may also pre-distort the imaginary portion of the digital signal and send the imaginary portion of the digital signal to the Q-DAC 316. In one implementation, the I-DAC 315 and the Q-DAC 316 may be 90 degrees out of phase.

The I-DAC 315 may receive an in-phase portion of the digital signal from the digital front end 110 and convert the real portion from the digital signal to a real portion of the analog signal. The Q-DAC 316 may receive an imaginary portion of the data from the digital front end 110 and convert the imaginary portion from the digital signal to an imaginary portion of the analog signal. The LO 318 may also be operatively coupled to the I-DAC 315 and the Q-DAC 316. The LO 318 may send a signal to the I-DAC 315 and the Q-DAC 316 for mixing. The signal from the LO 318 may be fed directly to the I-DAC 315 and the Q-DAC 316 in the communication system 300 were an RF-DAC is used and an up-mixing is performed at the I-DAC 315 and the Q-DAC 316.

The I-DAC 315 and the Q-DAC 316 may send the real and imaginary portions of the analog signals to the combiner 320. The combiner 320 may combine the real and imaginary portions of the analog signal to obtain an entire signal. The combiner 320 may send the entire signal to amplifier 114. In one example, the amplifier 114 may adjust an amplitude of the entire signal and send the entire signal to the antenna 110 for transmission to another device. In another example, software executing on a processing component may adjust the amplitude of the entire signal and the processing component may send the entire signal to the antenna 110 for transmission to the other device.

Figure 3B:
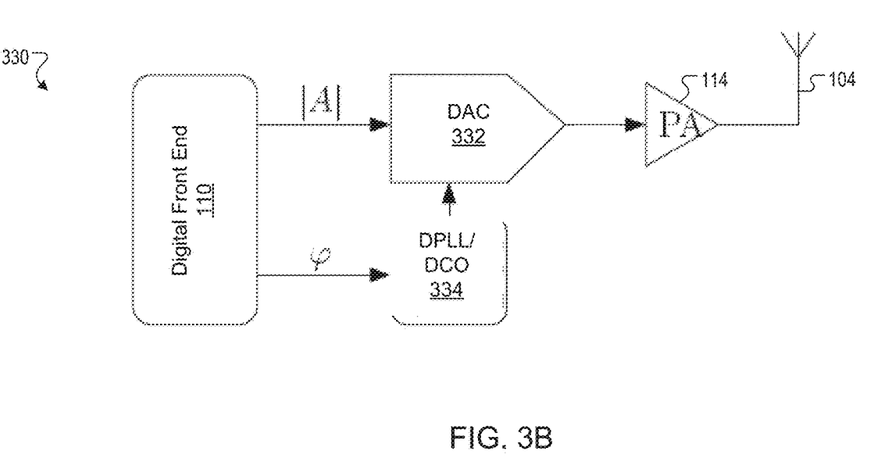
FIG. 3B illustrates a schematic level diagram of a communications circuit with a polar architecture according to one exemplary implementation.

FIG. 3B illustrates a schematic level diagram of a communications circuit 330 with a polar architecture according to one exemplary implementation. Some of the features in FIG. 3B are the same or similar to the some of the features in FIG. 1 as noted by same reference numbers, unless expressly described otherwise. The communications circuit 330 may be one implementation of the communications circuit 102 according to one exemplary implementation.

The communications circuit 330 may include the digital front end 110, a DAC 332, a digital phase lock loop/digital controlled oscillator (DPLL/DCO) 334, and the amplifier 114. The digital front end 110 may pre-distort the digital signal to compensate for nonlinearities generated by a power supply. The digital front end 110 may send the digital signal to the DAC 332.

The DPLL/DCO 334 may also be operatively coupled to the DAC 332. In the polar architecture the signal may include an inphase (I) plus a quadrature (Q) component, as represented by an amplitude (A) and phase (phi) to describe the complex vector. The DAC 332 may produce the amplitude information and the DPLL/DCO 334 may generate the phase information. The DPLL/DCO 334 may generate the phase information of the complex signal as the DAC 332 converts the digital signal to the analog signal. The DAC 332 may send the signal to amplifier 114. The amplifier 114 may adjust an amplitude of the signal and the signal to the antenna 110 for transmission. In another example, software executing on a processing component may adjust the amplitude of the signal and the processing component may send the entire signal to the antenna 110 for transmission to the other device.

Figure 3C:
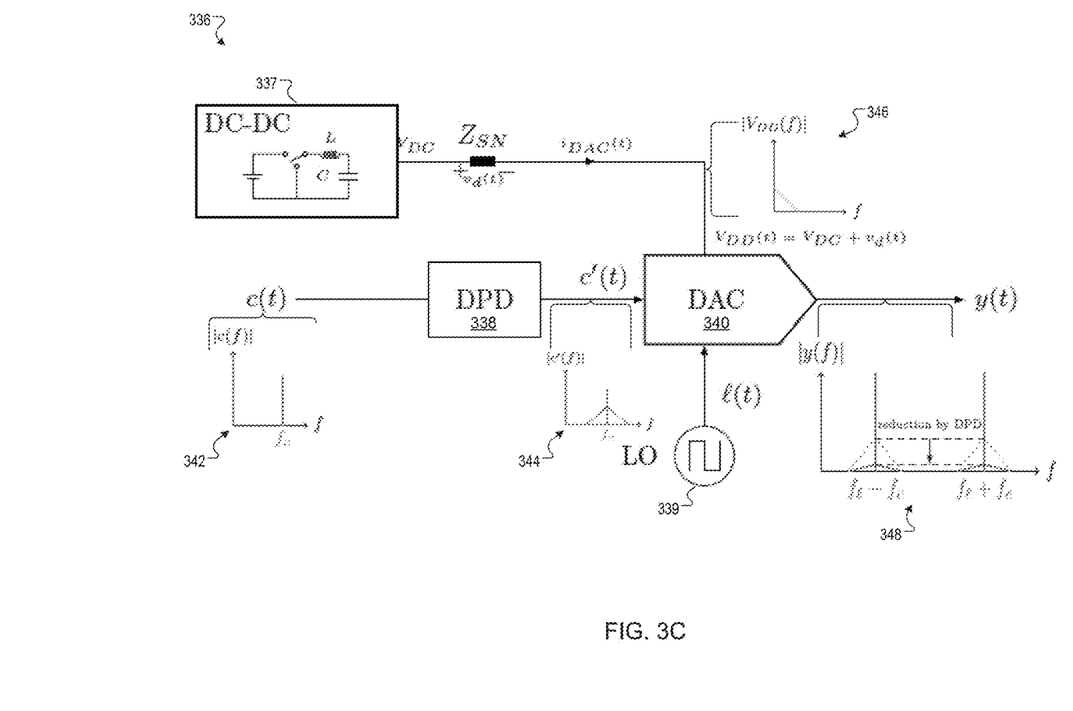
FIG. 3C illustrates a schematic level diagram of a communications circuit with a direct current (DC) to DC converter, a digital predistortion (DPD), and a DAC, according to one exemplary implementation.

FIG. 3C illustrates a schematic level diagram of a communications circuit 336 with a direct current (DC) to DC converter 337, a DPD 338, and a DAC 340, according to one exemplary implementation. The schematic level diagram may provide an overview on the influence of supply voltage variations on the output of the DAC 340 and a suppression of these variations with the DPD 338. The communications circuit 336 may be one implementation of the communications circuit 102 according to one exemplary implementation.

The schematic level diagram may refer to the time domain. For example a signal may be dependent on time (t). The DC to DC converter 337 may generate a supply voltage ($V_{DC}$). The $V_{DC}$ may be sent to the DAC 340 along a supply network. When the $V_{DC}$ is sent, the $V_{DC}$ may be an ideal or constant supply voltage, such as 1.1V. The supply network may include a supply line that introduces an impedance ($Z_{sn}$) that causes a variation in the $V_{DC}$ provided to the DAC 340. The DAC 340 may receive an non-ideal supply voltage ($V_{DD}$) 346 that includes the $V_{DC}$ with a distortion, fluctuation, or voltage drop ($v_d(t)$) over the supply network, e.g., $V_{DD}(t)$ 346 is the ideal supply voltage plus the $v_d(t)$. The $v_d(t)$ indicates there is distortions in the spectrum of $V_{DD}$ 346, as an ideal $V_{DC}$ may be a vertical line at f=0. The $i_{DAC}(t)$ may be a current drawn flowing from the DC to DC converter 337 to the DAC 340.

The DPD 338 may receive the digital input code c(t) 342. The c(f) shows a spectrum of the input code. In one implementation, the spectrum of the input code may show a real-valued single-tone signal, such as a sine wave with frequency $f_c$. The DPD 338 may be a pre-distortion circuit or a front-end circuit 400 as shown in FIG. 4. The c'(t) 344 may be a pre-distorted input code that is sent by the DPD 338 to the DAC 340, where c'(t)=c(t)−c(t)−v'(t). The c'(t) 344 may include a modulation of a recreated supply distortion v' with the input code c(t), as discussed below. The input code may be code generated by software as an input to the DAC 340. The spectrum c'(f) may include the single tone of the input code c(t) at the frequency $f_c$ and the modulation of c(t) with v'(t). v'(t) may represent $v_d(t)$ as good as possible with the same phase. The opposite phase for the compensation signal c'(t) comes from the—in the equation above. A compensation component may be represented as c(t)·v'(t). The local oscillator (LO) 339 may generate a signal l(t) that may be a carrier signal with a frequency $f_l$. The DAC may output a signal y(t) 348 with high distortion components (dotted lines around tones fl-fc and fl+fc). When using a DPD, the distortion component are removed and the output signal y(t) 348 may be substantially similar to an ideal output signal ($y_w(t)$), where a negligible amount of distortion may remain in y(t) 348. The DAC may use the c'(t) generated by the DPD 338 to significantly reduce the distortions or variabilities generated by the power supply or non-ideal DC to DC converter 337.

Figure 4:
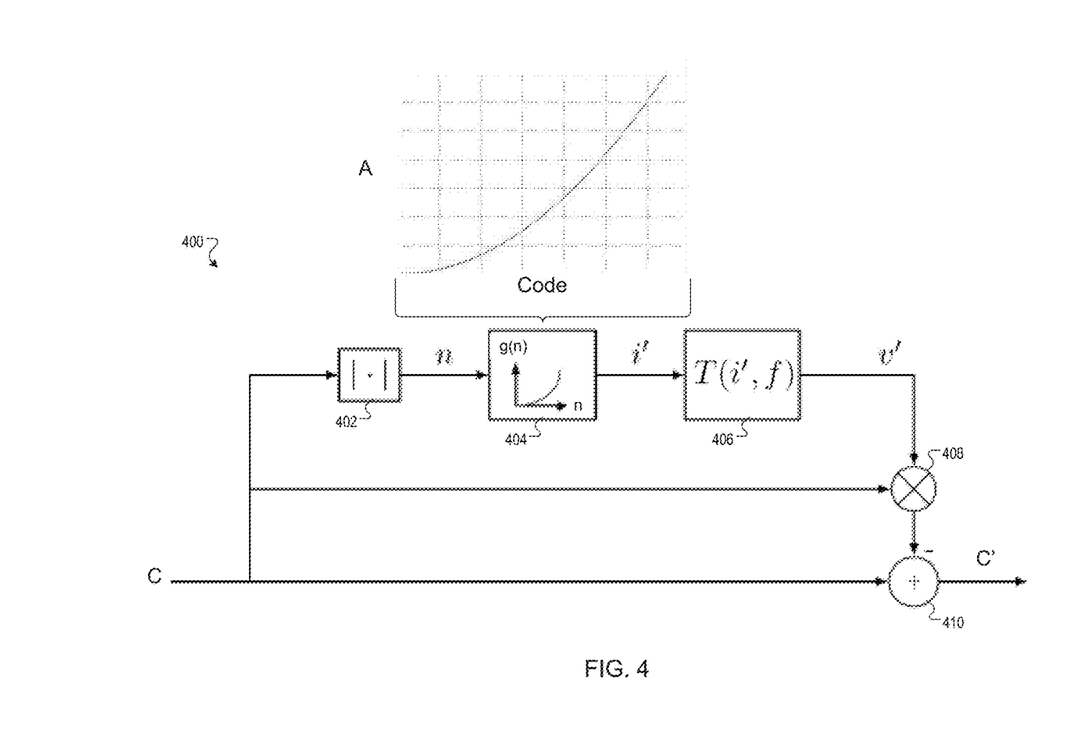
FIG. 4 illustrates a front-end circuit 400 to adjust a digital signal to compensate for variabilities in a supply voltage from a power supply that cause nonlinearities at a DAC of a communication device according to one exemplary implementation.

FIG. 4 illustrates a front-end circuit 400 to adjust a digital signal to compensate for variabilities in a supply voltage from a power supply that cause nonlinearities at a DAC of a communication device according to one exemplary implementation. FIG. 4 may represent the DPD in FIG. 3C. The front-end circuit 400 may include a processing component, such as a processor core, a microcontroller, or a central processing unit (CPU).

The processing component may receive a digital signal (C) from a signal processor. In one implementation, the digital signal may include a real portion and an imaginary portion. The processing component may be a signal generator, a processor, a waveform generator, a system on a chip (SoC) and so forth. The processing component may take an absolute value of an input signal c and translates the input signal into a number of active cells n of a DAC (block 402). For an I/Q architecture, as discussed above, n may be a sum of the absolute values of the real and imaginary portions of the digital signal, i.e. n=|c_I|+|c_Q|. For a polar architecture, as discussed above, n=|c|=$\sqrt{c_I^2+c_Q^2}$. The summation of the real and imaginary portions of the digital signal may indicate a number of active cells in a DAC.

The processing component may determine a nonlinear relation (g(n)) of the DAC input current over the number of active cells n to obtain an estimated current draw (i') (block 404). For example, g(n) may indicate a level of current the DAC pulls from the power supply. The output of the nonlinear function, i', may be a digital representation of the current draw. For example, the output of the nonlinear function, i', is an estimate of the current drawn by the DAC at a specified digital signal c.

The processing component may identify a power supply model associated with g(n) (block 406). In one implementation, the processing component may use a look-up table (LUT) to match the value of the nonlinear relation with a power supply model. In another implementation, a digital signal processor or a central processing unit may implement a polynomial or multiplication and addition operation to match the value of the nonlinear relation with a power supply model. In another implementation, a transformation function T(i',f) models a frequency and current dependent impedance of the supply network of the DAC, where i' is a dependency on the current and f is a dependency on the frequency. The function T(i',f) may operate as a digital infinite impulse response (IIR) filter or a finite impulse response (FIR) filter in the digital front-end. The function T(i',f) may map an estimated supply current i' to an estimated supply voltage variation v'. In one example, v' is a digital representation of the distortion from the supply network.

The compensation signal is a signal associated with a distortion of a reference voltage ($v_d$) that is used to compensate for the nonlinearities in the supply voltage from the power supply. For example, the output v' of the function T(i',f) represents the distortion of the supply voltage $v_d$. The processing component v' may be multiplied by c (block 408). In one example, v' is a representation of a distorted power supply and the distortion product is v'·C. In another example, $y_d'(t)$ may be a distortion product at the output of the DAC where $y_d'(t)$=n(t)/N*LO(t)*v'(t). The product of v' and c may be subtracted from c (block 410). For example, the front-end circuit 400 distorts the digital signal so that the amplitude of the data may be changed to compensate for the nonlinearities at the DAC. The nonlinearities are compensated for to match a signal output by a signal processor supplied with an ideal supply voltage.

The front-end circuit 400 may send the modified digital signal (C') to the DAC. Where the signal has been pre-distorted at the front-end circuit 400, when the variabilities of the supply voltage mix with the modified digital signal (C'), the mixture will generate a signal that is approximately the same as an input signal where the supply voltage is provided by an ideal supply voltage without any variabilities. Because the modified digital signal (C') has been pre-distorted to change the amplitude of the digital signal (C) at the defined frequency where the nonlinearities occur, the nonlinearities will mix with the modified digital signal (C') in the DAC to change the DAC output amplitude at the defined frequency to where it would have been had the nonlinearities not distorted the digital signal (C).

Figure 5:
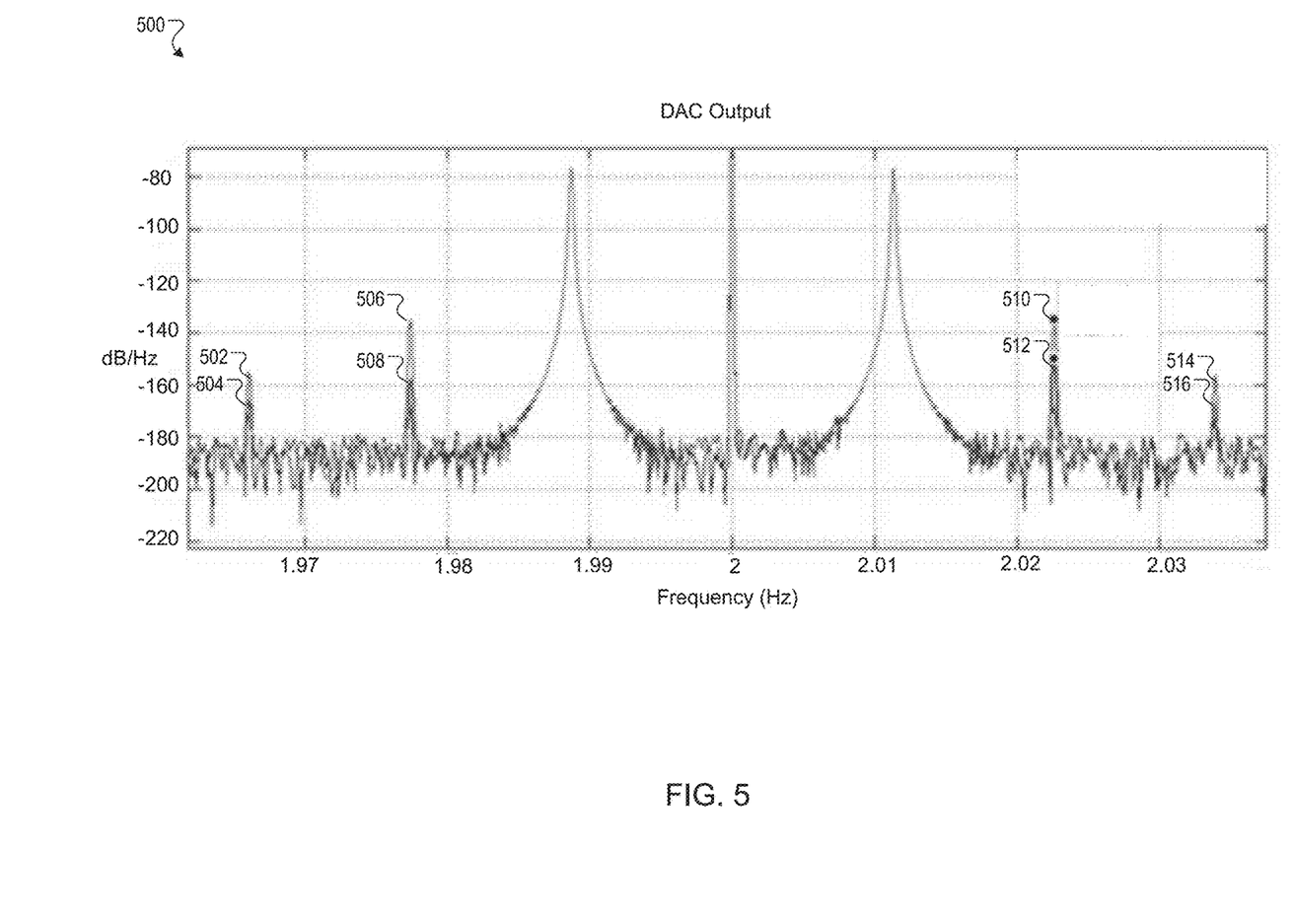
FIG. 5 illustrates a graph of an output signal of a DAC according to an exemplary implementation.

FIG. 5 illustrates a graph 500 of an output signal of a DAC according to an exemplary implementation. The graph 500 illustrates an analog signal generated by a DAC with distortions from the power supply at 1.965 megahertz (MHz), 1.977 MHz, 2.023 MHz, and 2.035 MHz. When the front-end circuit compensates for the distortions, a decibel (dB) levels of the analog signal at 1.965 MHz, 1.977 MHz, 2.023 MHz, and 2.035 MHz. For example, the front-end circuit may compensate for distortion at 1.965 MHz to reduce the decibel level of the signal from −155 db (502) to −170 db (504). The front-end circuit may compensate for distortion at 1.977 MHz to reduce the decibel level of the signal from −135 db (506) to −160 db (508). The front-end circuit may compensate for distortion at 2.023 MHz to reduce the decibel level of the signal from −135 db (510) to −150 db (512). The front-end circuit may compensate for distortion at 2.035 MHz to reduce the decibel level of the signal from −155 db (514) to −170 db (516). The front-end circuit may reduce the decibel level of the distortions caused by the power supply while the power of the signal power may be maintained.

Figure 6:
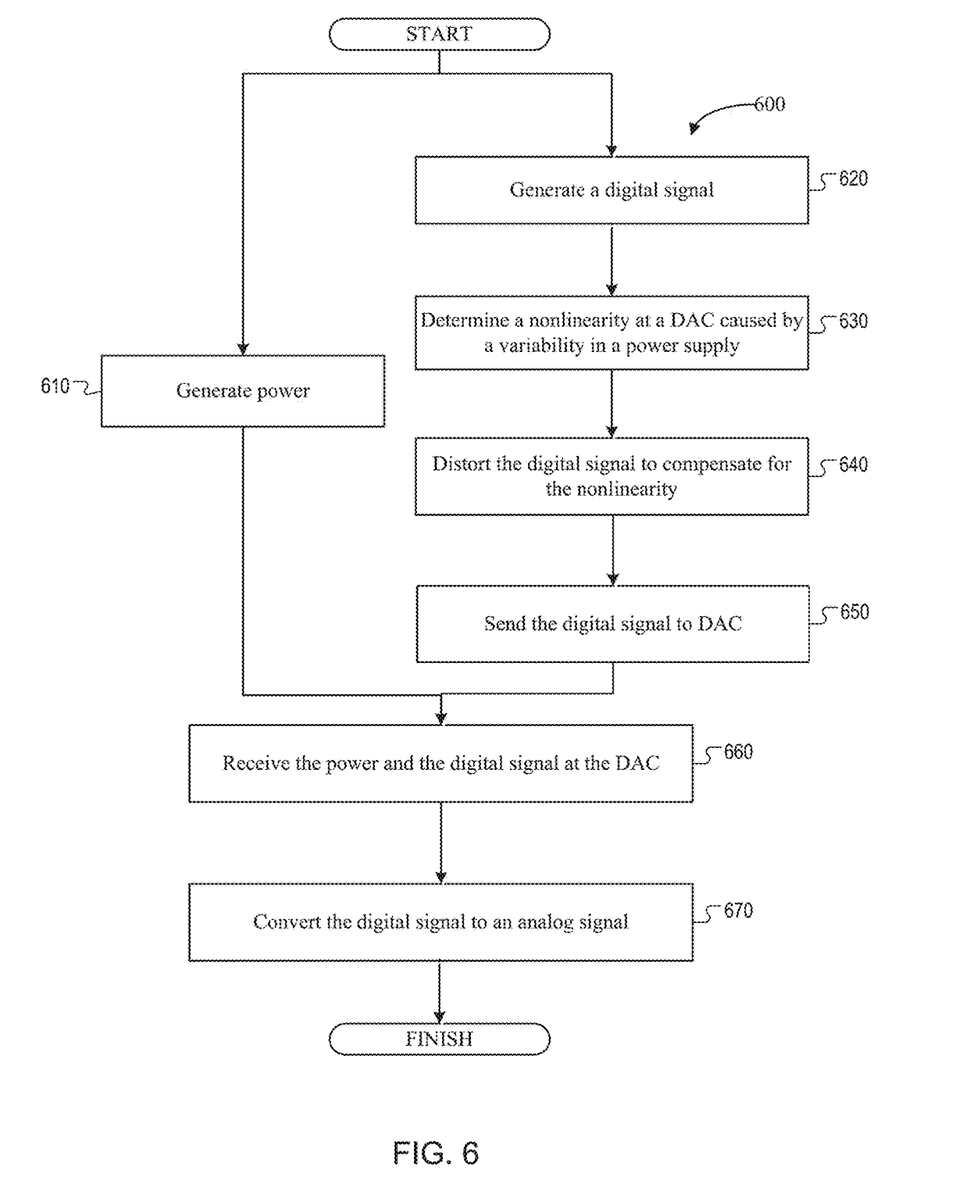
FIG. 6 illustrates a method for compensating the effect of variabilities in a supply voltage on an input signal to a digital to analog converter (DAC) according to one exemplary implementation.

FIG. 6 illustrates a method 600 for compensating the effect of nonlinearities in a supply voltage on an input signal to a digital to analog converter (DAC) according to one exemplary implementation. The method 600 may at least partially be performed by processing logic that includes hardware (e.g., circuitry, dedicated logic, a processing component, microcode, etc.), software (e.g., instructions executed by a processing component), firmware or a combination thereof. In one exemplary implementation, the method 600 may be performed by all or part of the mobile device 120 of FIG. 1. For example, the method 600 may be performed by the communication circuit 116.

Referring to FIG. 6, the method 600 begins at block 610 with a power supply generating power, wherein the power includes nonlinearities in a supply voltage. At block 620, a processing component generates a digital signal. At block 630, a front-end circuit determines a nonlinearity at the DAC caused by a variability at the power supply. The front-end circuit may be operatively coupled to the power supply and the processing component. At block 640, the front-end circuit may distort the digital signal to compensate for the nonlinearity. At block 650, the front-end circuit may send the digital signal to the DAC. At block 660, the DAC may receive the power from the power supply and receive the digital signal at the DAC. At block 670, the DAC may convert the digital signal to an analog signal, where the nonlinearities at the DAC are cancelled or suppressed by the distortion in the digital signal.

While the present disclosure describes a number of exemplary implementations, those skilled in the art will appreciate numerous modifications and variations therefrom. It is intended that the appended claims cover all such modifications and variations as fall within the true spirit and scope of this present disclosure.

The following examples pertain to further implementations.

Example 1 is an apparatus including: 1) a power supply to generate power; 2) a processing component to generate a digital signal; and 3) a front-end circuit operatively coupled to the power supply and the processing component, the front-end circuit to: a) receive the power from the power supply; b) receive the digital signal from the processing component; and c) process the digital signal to generate an input signal to compensate for a nonlinearity from a digital to analog converter (DAC) caused by a variability from the power supply.

Example 2 the apparatus of Example 1, wherein the processing of the digital signal substantially cancels the nonlinearity from the DAC.

In Example 3, the apparatus of any one of Examples 1-2, wherein to compensate for the nonlinearities at the DAC, the front-end circuit is further to: 1) determine a first magnitude of the digital signal at a frequency where the nonlinearities occurs; and 2) identify a compensation parameter in a look-up table that is associated with the magnitude of the digital signal at the frequency, wherein the compensation parameter indicates a second magnitude to change the digital signal by to compensate for the nonlinearities at the frequency.

In Example 4, the apparatus of any one of Examples 1-3, wherein to compensate for an effect of the nonlinearities on the digital signal, the front-end circuit further comprises a filter to filter the digital signal to change the signal at other frequencies to zero to obtain a compensation signal, wherein the front-end circuit is further to combine the compensation signal with the digital signal to obtain an input signal for the DAC.

In Example 5, the apparatus of any one of Examples 1-4, wherein the filter is a digital infinite impulse response (IIR) filter or a finite impulse response (FIR) filter.

In Example 6, the apparatus of any one of Examples 1-5, wherein the variability is caused by at least one of: 1) a voltage fluctuation at the power supply; 2) a impedance of a trace coupling the power supply to the DAC; or 3) a variation of a direct current (DC) output of the power supply.

In Example 7, the apparatus of any one of Examples 1-6, further comprising the DAC operatively coupled to the front-end circuit, the DAC to: 1) receive the input signal from the front-end circuit; and 2) convert the input signal to an analog signal.

In Example 8, the apparatus of any one of Examples 1-7, further comprising an amplifier operatively coupled to the DAC, the amplifier to adjust a magnitude of the analog signal.

In Example 9, the apparatus of any one of Examples 1-8, further comprising an antenna operatively coupled to the amplifier, the antenna to transmit the analog signal to a device.

In Example 10, the apparatus of any one of Examples 1-9, further comprising a digital phase-lock loop operatively coupled to the DAC, the digital phase-lock loop to generate the input signal.

In Example 11, the apparatus of any one of Examples 1-10, wherein the DAC is a capacitive digital to analog converter.

Various exemplary implementations may have different combinations of the structural features described above. For instance, all optional features of the computing system described above may also be implemented with respect to the method or process described herein and specifics in the examples may be used anywhere in one or more exemplary implementations.

Example 12 is a system including: 1) a processing component to generate a digital signal; 2) a front-end circuit operatively coupled to the processing component, the front-end circuit comprising: a) a means for receiving the digital signal from the processing component; and b) a means for distorting the digital signal to compensate for a nonlinearity at a digital to analog converter (DAC); 3) a first means for converting a first portion of the input signal to a first portion of an analog signal; and 4) a second means for converting a second portion of the input signal to a second portion of the analog signal.

In Example 13, the system of Example 12, wherein: 1) the first means for converting the first portion of the analog signal is an in-phase modulator, wherein the first portion of the analog signal is a real portion of the analog signal; and 2) the second means for converting the second portion of the analog signal is a quadrature modulator, wherein the second portion of the analog signal is an imaginary portion of the analog signal.

In Example 14, the system of Examples 12-13, further comprising a means for combining the real portion of the analog signal with the imaginary portion of the analog signal to obtain the analog signal.

In Example 15, the system of Examples 12-14, further comprising: 1) a power supply coupled to the front-end circuit, wherein the power supply is to generate power; and 2) a trace to couple the power supply to the first means for converting the first portion of the input signal and the second means for converting the second portion of the input signal, wherein the trace has impedance characteristics that cause a variability in power supplied to the DAC, and wherein the variability causes a nonlinearity at the DAC.

In Example 16, the system of Examples 12-15, wherein a fluctuation in the power is nonlinearly dependent on a digital input code of for the DAC.

In Example 17, the system of Examples 12-16, wherein the nonlinearities are caused by at least one of: 1) a voltage fluctuation at a power supply coupled to the front-end circuit; or 2) a variation of a direct current (DC) output of the power supply.

Various embodiments can have different combinations of the structural features described above. For instance, all optional features of the computing system described above can also be implemented with respect to the method or process described herein and specifics in the examples can be used anywhere in one or more embodiments.

Example 18 is a method including: 1) receiving power from a power supply, wherein the power includes a variation; 2) receiving a digital signal from a signal processor; and 3) pre-distorting the digital signal to compensate for a nonlinearity caused by the variation.

In Example 19, the method of Example 18, further comprising sending the digital signal to a digital to analog converter (DAC).

In Example 20, the method of any one of Examples 18-19, wherein the variation is caused by at least one of: 1) a voltage fluctuation of the power at the power supply; 2) an impedance of a trace coupling the power supply to a digital to analog converter (DAC); or 3) a variation of a direct current (DC) output of the power supply.

Various implementations may have different combinations of the structural features described above. For instance, all optional features of the computing system described above may also be implemented with respect to the method or process described herein and specifics in the examples may be used anywhere in one or more implementations.

While the present disclosure has been described with respect to a limited number of implementations, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and microarchitectural details, specific register configurations, specific instruction types, specific system components, specific measurements/heights, specific processor pipeline stages and operation etc. in order to provide a thorough understanding of the present disclosure. It will be apparent, however, that these specific details need not be employed to practice the present disclosure. In other instances, well-known components or methods, such as specific and alternative processor architectures, specific logic circuits/code for described algorithms, specific firmware code, specific interconnect operation, specific logic configurations, specific manufacturing techniques and materials, specific compiler exemplary implementations, specific expression of algorithms in code, specific power down and gating techniques/logic and other specific operational details of computer system have not been described in detail in order to avoid unnecessarily obscuring the present disclosure.

Instructions used to program logic to perform exemplary implementations of the disclosure can be stored within a storage element in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A module as used herein refers to any combination of hardware, software, and/or firmware. As an example, a module includes hardware, such as a microcontroller, associated with a non-transitory medium to store code adapted to be executed by the micro-controller. Therefore, a reference to a module, in one exemplary implementation, refers to the hardware, which is specifically configured to recognize and/or execute the code to be held in a non-transitory medium. Furthermore, in another exemplary implementation, use of a module refers to the non-transitory medium including the code, which is specifically adapted to be executed by the microcontroller to perform predetermined operations. And as can be inferred, in yet another exemplary implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one exemplary implementation, use of the term logic includes hardware, such as transistors, registers, or other hardware, such as processing component devices.

Use of the phrase 'configured to,' in one exemplary implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, operatively coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one operatively coupled in some manner that during operation the 1 or 0 output is to enable the clock. Note once again that use of the term 'configured to' does not require operation, but instead focuses on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one exemplary implementation, refers to some apparatus, logic, hardware, and/or element designed in such a way to enable use of the apparatus, logic, hardware, and/or element in a specified manner. Note as above that use of to, capable to, or operable to, in one exemplary implementation, refers to the latent state of an apparatus, logic, hardware, and/or element, where the apparatus, logic, hardware, and/or element is not operating but is designed in such a manner to enable use of an apparatus in a specified manner.

The exemplary implementations of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform exemplary implementations of the disclosure may be stored within a storage element in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one exemplary implementation" or "an exemplary implementation" means that a particular feature, structure, or characteristic described in connection with the exemplary implementation is included in at least one exemplary implementation of the present disclosure. Thus, the appearances of the phrases "in one exemplary implementation" or "in an exemplary implementation" on "in some exemplary implementations" in various places throughout this specification are not necessarily all referring to the same exemplary implementation. Furthermore, the particular features, structures, or characteristics may be combined in any suitable manner in one or more exemplary implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of exemplary implementation and other exemplary language does not necessarily refer to the same exemplary implementation or the same example, but may refer to different and distinct exemplary implementations, as well as potentially the same exemplary implementation.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "selecting," "receiving," "determining," "generating," "optimizing," "associating," "obtaining," "identifying," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an exemplary implementation" or "one exemplary implementation" or "an exemplary implementation" or "one exemplary implementation" throughout is not intended to mean the same exemplary implementation or exemplary implementation unless described as such. Also, the terms "first," "second," "third," "fourth," etc. as used herein are meant as labels to distinguish among different elements and may not necessarily have an ordinal meaning according to their numerical designation.

What is claimed is:

1. An apparatus comprising:
   a power supply to generate power;
   a processing component to generate a digital signal; and
   a front-end circuit operatively coupled to the power supply and the processing component, the front-end circuit to:
     receive the power from the power supply;
     receive the digital signal from the processing component; and
     process the digital signal to generate an input signal to compensate for a nonlinearity from a digital to analog converter (DAC) caused by a variability from the power supply, wherein to compensate for the nonlinearity at the DAC, the front-end circuit is further to:
       determine a first magnitude of the digital signal at a frequency where the nonlinearity occurs; and
       identify a compensation parameter in a look-up table that is associated with the magnitude of the digital signal at the frequency, wherein the compensation parameter indicates an amount to change the digital signal to compensate for the nonlinearity at the frequency.

2. The apparatus of claim 1, wherein the processing of the digital signal substantially cancels the nonlinearity from the DAC.

3. The apparatus of claim 1, wherein to compensate for an effect of the nonlinearity on the digital signal, the front-end circuit further comprises a filter to filter the digital signal to change the signal at other frequencies to zero to obtain a compensation signal, wherein the front-end circuit is further to combine the compensation signal with the digital signal to obtain an input signal for the DAC.

4. The apparatus of claim 3, wherein the filter is a digital infinite impulse response (IIR) filter or a finite impulse response (FIR) filter.

5. The apparatus of claim 1, wherein the variability is caused by at least one of:
a voltage fluctuation at the power supply;
a impedance of a trace coupling the power supply to the DAC; or
a variation of a direct current (DC) output of the power supply.

6. The apparatus of claim 1, further comprising the DAC operatively coupled to the front-end circuit, the DAC to:
receive the input signal from the front-end circuit; and
convert the input signal to an analog signal.

7. The apparatus of claim 6, further comprising an amplifier operatively coupled to the DAC, the amplifier to adjust a magnitude of the analog signal.

8. The apparatus of claim 7, further comprising an antenna operatively coupled to the amplifier, the antenna to transmit the analog signal to a device.

9. The apparatus of claim 6, further comprising a digital phase-lock loop operatively coupled to the DAC, the digital phase-lock loop to generate the input signal.

10. The apparatus of claim 6, wherein the DAC is a capacitive digital to analog converter.

11. A system comprising:
a processing component to generate a digital signal;
a front-end circuit operatively coupled to the processing component, the front-end circuit comprising:
a means for receiving the digital signal from the processing component; and
a means for distorting the digital signal to compensate for a nonlinearity caused when converting the digital signal to an analog signal; wherein the means for distorting comprises:
means for determining a first magnitude of the digital signal at a frequency where the nonlinearity occurs; and
means for identifying a compensation parameter associated with the magnitude of the digital signal at the frequency, the compensation parameter indicating an amount of change to the digital signal to compensate for the nonlinearity at the frequency;
a first means for converting a first portion of the digital signal to a first portion of the analog signal; and
a second means for converting a second portion of the digital signal to a second portion of the analog signal.

12. The system of claim 11, wherein:
the first means for converting the first portion of the analog signal comprises an in-phase modulator, wherein the first portion of the analog signal is a real portion of the analog signal; and
the second means for converting the second portion of the analog signal comprises a quadrature modulator, wherein the second portion of the analog signal is an imaginary portion of the analog signal.

13. The system of claim 12, further comprising a means for combining the real portion of the analog signal with the imaginary portion of the analog signal to obtain the analog signal.

14. The system of claim 11, further comprising:
a power supply coupled to the front-end circuit, wherein the power supply is to generate power; and
a trace to couple the power supply to the first means for converting the first portion of the digital signal and the second means for converting the second portion of the digital signal, wherein the trace has impedance characteristics that cause a variability in power supplied to the front-end circuit, and wherein the variability causes a nonlinearity at the front-end circuit.

15. The system of claim 14, wherein a fluctuation in the power is nonlinearly dependent on a digital input code.

16. The system of claim 11, wherein the nonlinearity is caused by at least one of:
a voltage fluctuation at a power supply coupled to the front-end circuit; or
a variation of a direct current (DC) output of the power supply.

17. A method comprising:
receiving power from a power supply, wherein the power includes a variation;
receiving a digital signal from a signal processor; and
pre-distorting the digital signal to compensate for a nonlinearity caused by the variation, wherein the pre-distorting comprises:
determining a first magnitude of the digital signal at a frequency where the nonlinearity occurs; and
identifying a compensation parameter associated with the magnitude of the digital signal at the frequency, the compensation parameter indicating an amount of change to the digital signal to compensate for the nonlinearity at the frequency.

18. The method of claim 17, further comprising sending the digital signal to a digital to analog converter (DAC).

19. The method of claim 17, wherein the variation is caused by at least one of:
a voltage fluctuation of the power at the power supply;
an impedance of a trace coupling the power supply to a digital to analog converter (DAC); or
a variation of a direct current (DC) output of the power supply.

* * * * *